United States Patent
Wang

(10) Patent No.: US 11,233,221 B2
(45) Date of Patent: Jan. 25, 2022

(54) MANUFACTURING METHOD OF A RIGID ORGANIC LIGHT-EMITTING DIODE (OLED) DISPLAY PANEL AND A DISPLAY PANEL

(71) Applicant: Wuhan China Star Optoelectronics Semiconductor Display Technology Co., Ltd., Wuhan (CN)

(72) Inventor: Chaoliang Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/499,284

(22) PCT Filed: Apr. 26, 2019

(86) PCT No.: PCT/CN2019/084467
§ 371 (c)(1),
(2) Date: Sep. 29, 2019

(87) PCT Pub. No.: WO2020/186602
PCT Pub. Date: Sep. 24, 2020

(65) Prior Publication Data
US 2021/0408452 A1     Dec. 30, 2021

(30) Foreign Application Priority Data
Mar. 19, 2019   (CN) .......................... 201910207714.2

(51) Int. Cl.
*H01L 29/08* (2006.01)
*H01L 51/52* (2006.01)
(Continued)

(52) U.S. Cl.
CPC .......... *H01L 51/5253* (2013.01); *H01L 51/56* (2013.01); *H05K 1/189* (2013.01); *H05K 2201/10128* (2013.01)

(58) Field of Classification Search
CPC ............. H01L 27/3251; H01L 27/3262; H01L 27/3274; H01L 51/5246; H01L 51/5253; H01L 51/56; H05K 1/189
(Continued)

(56) References Cited

U.S. PATENT DOCUMENTS

2007/0158656 A1* 7/2007 Lee .................... G02F 1/133305
257/72
2014/0042398 A1* 2/2014 Choi ................... H01L 27/3244
257/40
(Continued)

FOREIGN PATENT DOCUMENTS

| CN | 104503122 A | 4/2015 |
| CN | 106356380 A | 1/2017 |

(Continued)

*Primary Examiner* — Brook Kebede
(74) *Attorney, Agent, or Firm* — Nathan & Associates; Menachem Nathan

(57) ABSTRACT

Disclosed is a manufacturing method of a rigid organic light-emitting diode (OLED) display panel and a display panel. The method comprises steps of providing a first substrate having a first glass substrate and a flexible film; coating an organic compound on the first glass substrate; providing a second substrate; packaging the display area; and cutting and stripping a part of the first glass substrate at the non-display area of the packaged display panel, thereby improving the screen accounting of the display area in the rigid OLED display panel.

20 Claims, 3 Drawing Sheets

(51) Int. Cl.
*H05K 1/18* (2006.01)
*H01L 51/56* (2006.01)

(58) Field of Classification Search
USPC .................................................... 257/40, 88
See application file for complete search history.

(56) References Cited

U.S. PATENT DOCUMENTS

| | | |
|---|---|---|
| 2016/0149164 A1* | 5/2016 | Lee .................. H01L 51/56 |
| | | 257/40 |
| 2016/0181345 A1 | 6/2016 | Lee et al. |
| 2016/0187686 A1 | 6/2016 | Lou et al. |
| 2017/0076687 A1 | 3/2017 | Lou et al. |
| 2018/0159072 A1* | 6/2018 | Kim .................. H01L 27/3246 |
| 2018/0337332 A1 | 11/2018 | Deng |
| 2019/0067575 A1 | 2/2019 | Li et al. |

FOREIGN PATENT DOCUMENTS

| | | |
|---|---|---|
| CN | 106653777 A | 5/2017 |
| CN | 107112348 A | 8/2017 |
| CN | 107195642 A | 9/2017 |
| CN | 107611158 A | 1/2018 |
| CN | 108254962 A | 7/2018 |
| CN | 109116649 A | 1/2019 |
| JP | 2018036300 A | 3/2018 |

* cited by examiner

MANUFACTURING METHOD OF A RIGID ORGANIC LIGHT-EMITTING DIODE (OLED) DISPLAY PANEL AND A DISPLAY PANEL

FIELD OF INVENTION

The present invention relates to the display technical field, and in particular, to a manufacturing method of a rigid organic light-emitting diode (OLED) display panel and a display panel.

BACKGROUND OF INVENTION

An organic light-emitting diode (OLED) display, also known as an organic electroluminescent display, is an emerging display device possessing advantages of simple manufacturing process, low cost, low power consumption, high brightness, wide operating temperature range, thin volume, fast response times, and easy to implement color display and large screen display, easy to implement matching integrated circuit driver, easy to implement flexible display and so on, and thus has broad application prospects.

There are two types of the OLED, including a rigid organic light-emitting diode (rigid OLED) and a flexible organic light-emitting diode (flexible OLED), which differ greatly in the manufacturing process and flow. Specifically, the rigid OLED prepared by using glass as a substrate is more mature and stable in the technique; however, the rigid OLED also has certain shortcomings compared with the flexible OLED, such as a product with a thicker thickness and the terminal area is a glass substrate where the pad bending cannot be performed so that the non-display area of the mobile phone is too large to affect the screen-to-body ratio of the mobile phone in the follow-up process of the mobile phone assembling.

In current narrow frame design, even if the width of the frame is reduced, it is difficult for the frame of the liquid crystal display to be reduced due to the size limitation of the peripheral circuit. At the same time, in order to reduce the size of the frame, the peripheral circuit which is reduced to the limit is easy to affect the charging effect and the circuit yield.

SUMMARY OF INVENTION

An object of the present invention is to provide a manufacturing method of a rigid organic light-emitting diode (OLED) display panel and a display panel, which can increase a screen-to-body ratio of the display area in the rigid OLED display panel.

In order to solve the aforementioned problem, in the first aspect, the present invention provides a manufacturing method of a rigid organic light-emitting diode (OLED) display panel for the problem of the lower screen-to-body ratio of the rigid OLED display panel, the method comprising steps of: providing a first substrate, wherein the first substrate includes a first glass substrate and a flexible film; the flexible film covers the first glass substrate, and the flexible film includes a first area and a second area; the first area corresponds to a display area of the display panel, and the second area corresponds to a non-display area of the display panel; coating an organic compound on the first glass substrate; providing a second substrate, wherein the second substrate is disposed relative to the first substrate; providing a package material between the first substrate and the second substrate, and oppositely bonding the first substrate with the second substrate to package the display area; cutting and stripping a part of the first glass substrate at the non-display area of the packaged display panel. The interior of the first glass substrate is provided with a groove, and coating the first glass substrate includes coating an organic compound on the groove of the first glass substrate.

The method further includes steps of: providing a package material between the first substrate and the second substrate, and oppositely bonding the first substrate with the second substrate to package the display area, and bonding a flexible printed circuit board with the packaged first glass substrate at the non-display area.

A manufacturing method of a rigid organic light-emitting diode (OLED) display panel, the method comprising steps of: providing a first substrate, wherein the first substrate includes a first glass substrate and a flexible film; the flexible film covers the first glass substrate, and the flexible film includes a first area and a second area; the first area corresponds to a display area of the display panel, and the second area corresponds to a non-display area of the display panel; coating an organic compound on the first glass substrate; providing a second substrate, wherein the second substrate is disposed relative to the first substrate; providing a package material between the first substrate and the second substrate, and oppositely bonding the first substrate with the second substrate to package the display area; and cutting and stripping a part of the first glass substrate at the non-display area of the packaged display panel.

Further, the interior of the first glass substrate is provided with a groove, and coating the first glass substrate includes a step of: coating an organic compound on the groove of the first glass substrate.

Further, coating the organic compound on the groove disposed inside of the first glass substrate is coating a polyimide on the first glass substrate.

Further, a depth of the groove is 10-30 μm.

Further, an upper surface of the groove coated with the organic compound is at an identical horizontal level with an upper surface of the first glass substrate.

Further, the method further includes steps of: providing a package material between the first substrate and the second substrate, and oppositely bonding the first substrate with the second substrate to package the display area, and bonding a flexible printed circuit board with the packaged first glass substrate at the non-display area.

Further, the flexible printed circuit board includes a first circuit and a second circuit.

Further, the method further includes a step of: bending the flexible printed circuit board and the flexible film to bonding the flexible printed circuit board and the flexible film with a side of the first substrate and the display panel.

Further, the step of cutting and stripping the part of the first glass substrate at the non-display area of the packaged display panel includes a step of: using a laser strip to strip the part of the first glass substrate at the non-display area of the packaged display pane.

Further, the method further includes a step of: fixing and protecting the bent flexible printed circuit board and the bent flexible film.

In the second aspect, the present invention provides a display panel, including: a first substrate including a first glass substrate and a flexible film, wherein the flexible film is located above the first glass substrate and includes a first area and a second area; the first area corresponds to a display area of the display panel, and the second area attaches to a side of the display panel; the first glass substrate is provided with a groove configured to conduct a coating of an organic compound; a second substrate disposed relative to the first substrate; and a package material between the first substrate and the second substrate, and the package material is configured to package the display area.

Further, a surface of the groove with the coating of the organic compound is at an identical horizontal level with an upper surface of the first glass substrate.

Further, the groove is configured to conduct a polyimide coating.

Further, the display panel further includes a flexible printed circuit board at the non-display area, wherein the flexible printed circuit board is attached to the non-display area of the display panel.

Further, the flexible printed circuit board includes a first circuit and a second circuit.

Further, the flexible printed circuit board and the flexible film are configured to be bent to be attached to a side of the first substrate and the display panel.

Further, a part of the first glass substrate at the non-display area is configured to be cut and stripped.

Further, the part of the first glass substrate at the non-display area is configured to be cut and stripped by using a laser strip.

Further, the display panel further includes a protecting layer configured to protect the bent flexible film and the bent flexible printed circuit board.

The present invention has the beneficial effects that the rigid OLED process possesses the technique of coating and stripping by adding the technique of the flexible OLED process to the rigid OLED process without changing the big picture of the OLED process, and with coating the organic compound on the first glass substrate at the non-display area in the rigid OLED display panel and stripping the first glass substrate at the non-display area in the rigid OLED display panel, the non-display area in the rigid OLED display panel can be bent, thereby reducing the size of the non-display areas in the rigid OLED display panel in such a manner that a screen-to-body ratio of the display area in the rigid OLED display panel can be increased.

BRIEF DESCRIPTION OF THE DRAWINGS

To describe the technical solutions of the embodiments or the prior art more clearly, the following outlines briefly the accompanying drawings for describing the embodiments of the present invention or the prior art. Apparently, the accompanying drawings described below are merely about some embodiments of the present invention, and persons of ordinary skill in the art can derive other drawings from the accompanying drawings without any creative effort.

DETAILED DESCRIPTION OF EMBODIMENTS

Figure 1:
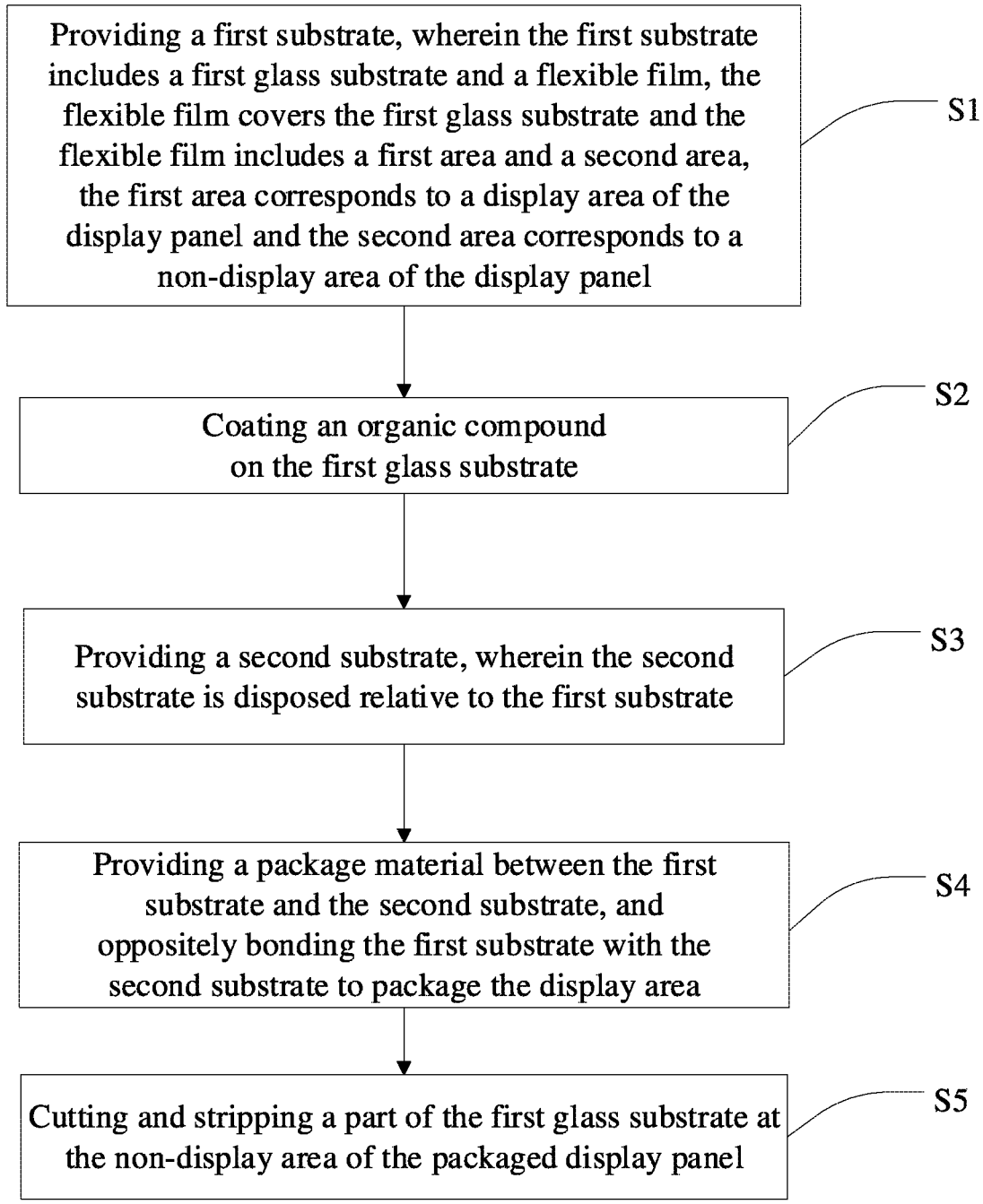
FIG. 1 is a flowchart of the manufacturing method of the rigid OLED display panel according to the embodiment of the present invention.

The following embodiments are referring to the accompanying drawings for exemplifying specific implementable embodiments of the present invention. Furthermore, directional terms described by the present invention, such as "upper", "lower", "front", "back", "left", "right", "inner", "outer", "side" and etc., are only directions by referring to the accompanying drawings, and thus the used directional terms are used to describe and understand the present invention, but the present invention is not limited thereto. In the drawings, structure-like elements are labeled with like reference numerals.

The drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that, when an element such as a layer, film, region, or substrate is referred to as being "on" another element, it can be directly on the other element or intervening elements may also be present.

In addition, in the specification, unless explicitly described to the contrary, the word "comprise" will be understood to imply the inclusion of stated elements but not the exclusion of any other elements. Furthermore, in the specification, "on" implies being positioned above or below a target element and does not imply being necessarily positioned on the top on the basis of a gravity direction.

In order to further elaborate the technical means and effect adopted by the present invention for achieving the objectives of the present invention, specific embodiments, structure, characteristics and effect of the manufacturing method of the rigid organic light-emitting diode (OLED) display panel and the rigid OLED display panel proposed in the present invention are described in detail as follows.

As shown in FIG. 1, a flowchart showing a manufacturing method of a rigid organic light-emitting diode (OLED) display panel according to an embodiment of the present invention is illustrated, the method comprising steps of:

S1: providing a first substrate 10, wherein the first substrate 10 includes a first glass substrate 11 and a flexible film 12. The flexible film 12 covers the first glass substrate 11, and the flexible film 12 includes a first area 12a and a second area 12b. The first area 12a corresponds to a display area of the display panel, and the second area 12b corresponds to a non-display area of the display panel;

S2: coating an organic compound on the first glass substrate 11;

S3: providing a second substrate 20, wherein the second substrate 20 is disposed relative to the first substrate 10;

S4: providing a package material between the first substrate 10 and the second substrate 20, and oppositely bonding the first substrate 10 with the second substrate 20 to package the display area;

S5: cutting and stripping the first glass substrate 11 at the non-display area of the packaged display panel.

Figure 2:
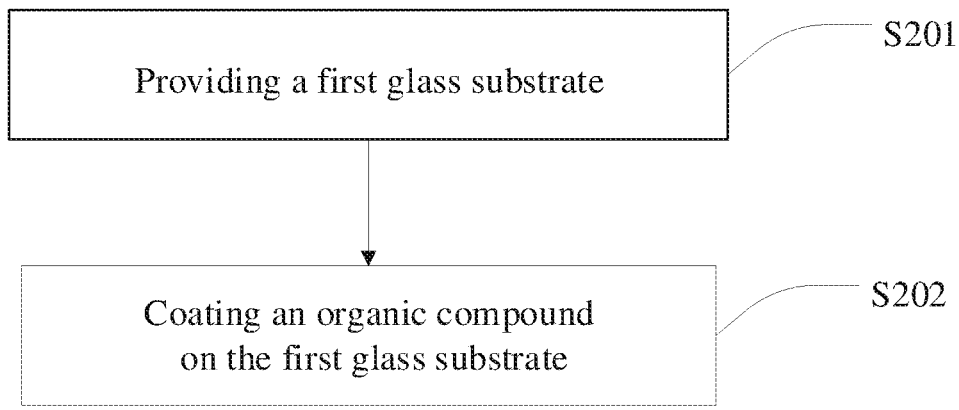
FIG. 2 is a flowchart of step 2 in the manufacturing method of the rigid OLED display panel according to the embodiment of the present invention.

In some embodiments of the present invention, as shown in FIG. 2, the step S1 includes steps of:

S201: providing the first substrate 11;

S202: manufacturing a flexible film 12 on the first substrate 11.

It should be noted that, the first substrate 11 is provided with a plurality of grooves, wherein the depth and width of the grooves could be altered based on the needs of different products. A depth of the groove is 10-30 μm.

Preferably, the number of the plurality of grooves can be three, four and so on, and a depth of the groove can be 10 μm, 20 μm and 30 μm and so on.

In some embodiments provided herein, the flexible film 12 includes a first area 12a and a second area 12b, and the first area 12a corresponds to a display area of the display panel and the second area 12b corresponds to a non-display area of the display panel.

In other embodiments of the present invention, the step S2 of coating the organic compound on the first glass substrate 11 can be coating polyimide on the first glass substrate 11.

It should be noted that, coating the organic compound on the first glass substrate 11 is coating the organic compound on the groove of the first glass substrate 11, and an upper surface of the groove coated with the organic compound is at an identical horizontal level with an upper surface of the first glass substrate 11. It should be noted that, the method of coating of the groove which can refer to the prior art is not limited here.

Figure 3:
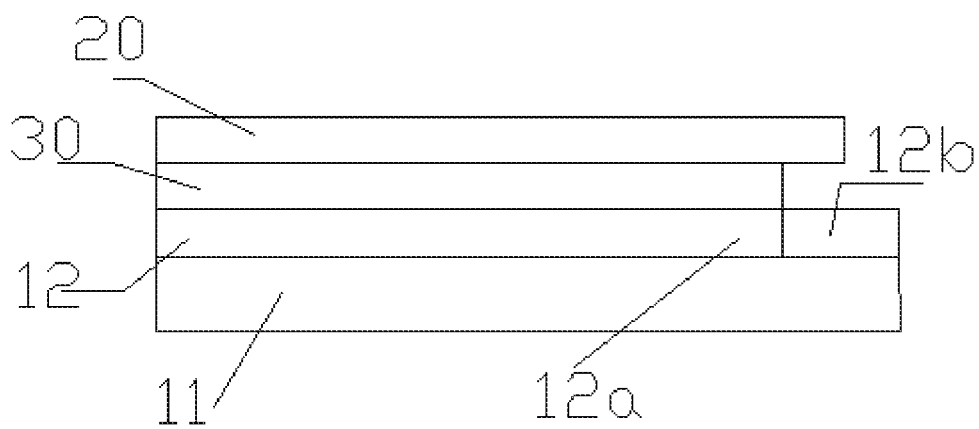
FIG. 3 is a cross-sectional view of a display panel after packaging the display panel according to an embodiment of the present invention.

In some embodiments of the present invention, the step S4 further includes filling a liquid crystal layer between the first glass substrate 11 and the second glass substrate 12, please refer to FIG. 3 illustrating across-sectional view of a packaged display panel according to the embodiment of the present invention.

Figure 4:
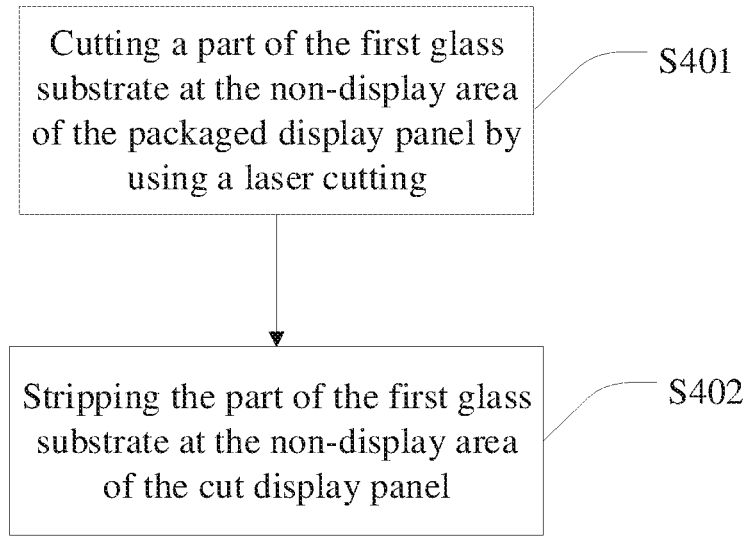
FIG. 4 is a flowchart of step 5 in the manufacturing method of the rigid OLED display panel according to the embodiment of the present invention.

In other embodiments of the present invention, please refer to FIG. 4, there is illustrated a flowchart of step 5 in the manufacturing method of the rigid OLED display panel according to an embodiment of the present invention, and the step 5 can includes steps of:

S401: cutting the first glass substrate at the non-display area of the packaged display panel by using laser;

S402: stripping the first glass substrate at the non-display area of the cut display panel.

Figure 5:
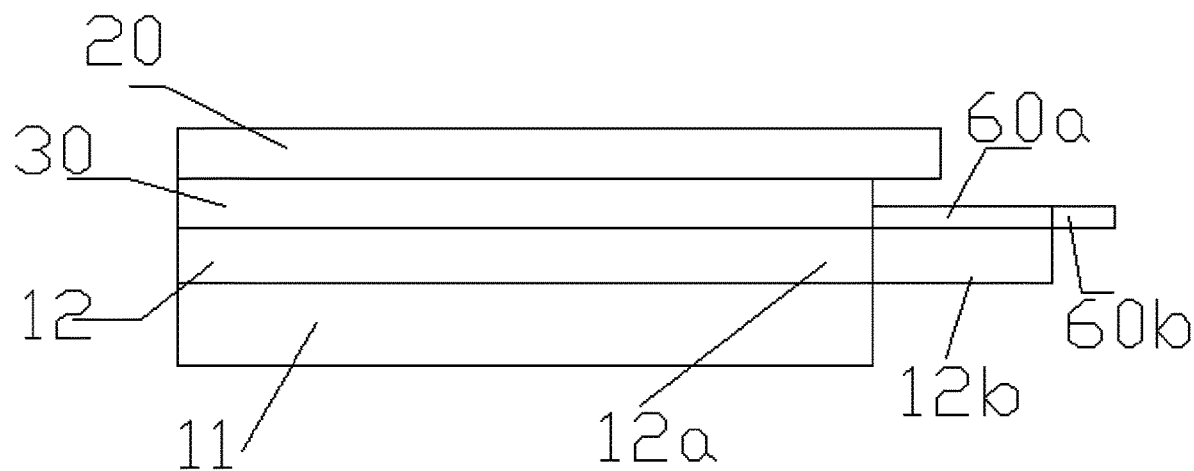
FIG. 5 is a cross-sectional view of a display panel after stripping a first glass substrate according to the present invention.

As shown in FIG. 5 illustrates a cross-sectional view of the structure of the display panel following the step of stripping the first glass substrate provided by the invention. On the basis of the structure of the display panel shown in FIG. 3, cutting a part of the first glass substrate 11 at the non-display area in such a manner that the first substrate 10 includes the first glass substrate 11 and the flexible film 12 covering the entire first glass substrate 11, and the first area 12a is located at the display area of the first substrate 10, and the second area 12b of the flexible film 12 corresponds to an area beyond the display area of the first substrate 10.

In some embodiments of the present invention, the method further includes step of providing a package material between the first substrate and the second substrate, and oppositely bonding the first substrate with the second substrate to package the display area, and bonding a flexible printed circuit board 60 with the packaged first glass substrate at the non-display area.

Specifically, the flexible printed circuit board 60 includes a first circuit 60a and a second circuit 60b, wherein the first circuit 60a is attached to the second area 12b of the flexible film 12, and the second circuit 60b exceeds the second area 12b of the flexible film 12.

Following the step of providing a package material between the first substrate and the second substrate, and oppositely bonding the first substrate with the second substrate to package the display area, and bonding a flexible printed circuit board 60 with the packaged first glass substrate at the non-display area, the method further includes step of: bending the flexible printed circuit board and the flexible film to bonding the flexible printed circuit board and the flexible film with a side of the first substrate and the display panel.

Specifically, the second area 12b of the flexible film 12 and the flexible printed circuit board 60 are bent in such a manner that the bent second area 12b of the flexible film 12 and the flexible printed circuit board 60 are attached to the side of the first substrate 10.

In the above steps, in order to reduce the width of the frame of the display manufactured using the above panel, if the length of the flexible printed circuit board 60 exceeds the thickness of the first substrate 10, the excess portion of the flexible printed circuit board 60 will be bent and attached to the upper surface of the first substrate 10.

Following the step of bending the flexible printed circuit board and the flexible film to bonding the flexible printed circuit board and the flexible film with a side of the first substrate and the display panel, in order to facilitate the detection of the defect of the flexible printed circuit board 60, the method can further includes a step of fixing and protecting the bent flexible film 12 and the bent flexible printed circuit board. For example, the bent flexible film 12 and the flexible printed circuit board 60 may be fixed by using a transparent tape, polyimide adhesive or the like, and then the bent flexible film 12 and the flexible printed circuit board 60 may be protected by using an optical clear adhesive, UV-curable adhesive, heat curing adhesive or the like. In particular, in the case where the flexible printed circuit board 60 is abnormal, the circuit fault can be directly observed for the use of detection of the defect by using the optical clear adhesive to protect the flexible printed circuit board 60.

The invention further provides a display panel including a first substrate 10, a second substrate 20 and a package material 40. The first substrate 10 includes a first glass substrate 11 and a flexible film 12, wherein the flexible film 12 is located above the first glass substrate 11 and includes a first area 12a and a second area 12b. The first area corresponds to a display area of the display panel, and the second area attaches to a side of the display panel. The second substrate 20 is disposed relative to the first substrate 10. The package material 40 is located between the first substrate 10 and the second substrate 20, and a package area located at the package material 40 is the display area.

It should be noted that the first glass substrate 11 is provided with a plurality of grooves configured to conduct a coating of an organic compound, and the depth and width of the grooves could be altered based on the needs of different products. A depth of the groove is 10-30 μm.

Preferably, the number of the plurality of grooves can be three, four and so on, and a depth of the groove can be 10 μm, 20 μm, and 30 μm and so on.

The organic compound coating on the groove can be polyimide, and an upper surface of the groove coated with the organic compound is at an identical horizontal level with an upper surface of the first glass substrate 11. It should be noted that, the method of coating of the groove which can refer to the prior art is not limited here.

In other embodiments of the present invention, the display panel further includes a flexible printed circuit board 60 which includes a first circuit 60a and a second circuit 60b, wherein the first circuit 60a is attached to the second area 12b of the flexible film 12, and the second circuit 60b exceeds the second area 12b of the flexible film 12.

Figure 6:
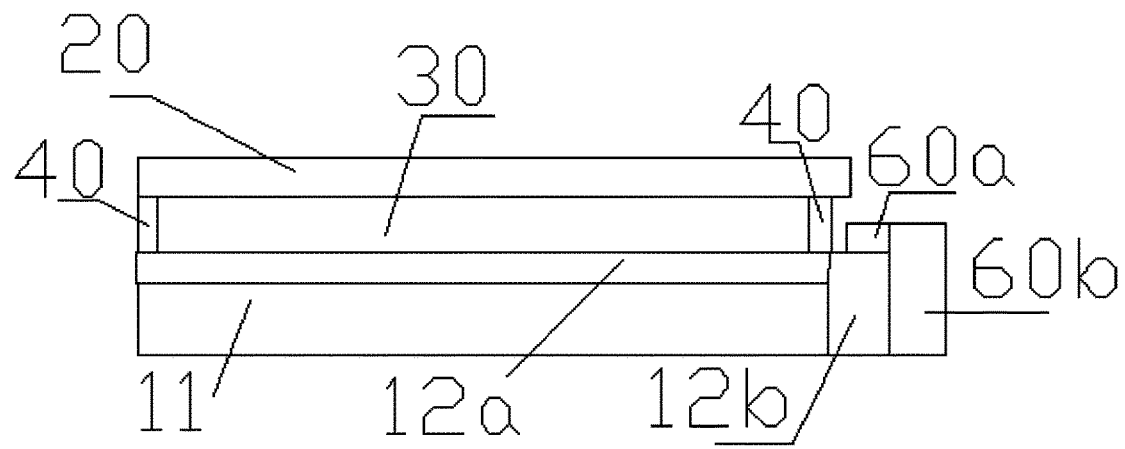
FIG. 6 is a cross-sectional view of a display panel according to an embodiment of the present invention.

As shown in FIG. 6 illustrating a cross-sectional view of the display panel according to an embodiment of the present invention shows that the second area of the flexible film 12 and the flexible printed circuit board 60 are in the bent state, and the second area of the flexible film 12 and the flexible printed circuit board 60 are attached to the side of the first substrate 10.

Further, in order to reduce the width of the frame of the display manufactured using the above panel, if the length of the flexible printed circuit board 60 exceeds the thickness of the first substrate 10, the excess portion of the flexible printed circuit board 60 will be bent and attached to the upper surface of the first substrate 10.

In some embodiments of the present invention, in order to facilitate the detection of the defect of the flexible printed circuit board 60, the bent flexible film 12 and the bent flexible printed circuit board may be fixed and protected. For example, the bent flexible film 12 and the flexible printed circuit board 60 may be fixed by using a transparent tape, polyimide adhesive or the like, and then the bent flexible film 12 and the flexible printed circuit board 60 may be protected by using an optical clear adhesive, UV-curable adhesive, heat curing adhesive or the like. In particular, in the case where the flexible printed circuit board 60 is abnormal, the circuit fault can be directly observed for the use of detection of the defect by using the optical clear adhesive to protect the flexible printed circuit board 60.

According to the above objects of the present invention, there is provided a display panel including the manufacturing method of the rigid OLED display panel mentioned above. The working principle of the display panel provided by the present embodiment is consistent with the working principle of the embodiment of the manufacturing method of the rigid OLED display panel mentioned previously, and thus the relationship of the specific structure and working principle can refer to the manufacturing method of the rigid OLED display panel mentioned previously, which will not be described in detail herein.

According to the above objects of the present invention, there is provided a display module including the display panel mentioned above. The working principle of the display module provided by the present embodiment is consistent with the working principle of the embodiment of the display panel mentioned previously, and thus for the specific structure relationship and working principle can refer to the manufacturing method of the display panel mentioned previously, which will not be described in detail herein.

In summary, although a few preferred embodiments of the present invention have been disclosed, the above preferred embodiments are not used for limiting this invention, and it will be understood by those of ordinary skill in the art that various changes in form and details may be made therein without departing from the spirit and scope of the present invention. The protection scope of the present invention is based on the scope of the appended claims.

What is claimed is:

1. A manufacturing method of a rigid organic light-emitting diode (OLED) display panel, comprising steps of:
   providing a first substrate, wherein the first substrate includes a first glass substrate and a flexible film; the flexible film covers the first glass substrate, and the flexible film includes a first area and a second area; the first area corresponds to a display area of the display panel, and the second area corresponds to a non-display area of the display panel;
   coating an organic compound on the first glass substrate;
   providing a second substrate, wherein the second substrate is disposed relative to the first substrate;
   providing a package material between the first substrate and the second substrate, and oppositely bonding the first substrate with the second substrate to package the display area;
   cutting and stripping a part of the first glass substrate at the non-display area of the packaged display panel; and
   coating the first glass substrate, including: coating an organic compound on a groove disposed inside the first glass substrate;
   wherein the manufacturing method further comprises a step of: providing a package material between the first substrate and the second substrate, and oppositely bonding the first substrate with the second substrate to package the display area, and bonding a flexible printed circuit board with the packaged first glass substrate at the non-display area.

2. A manufacturing method of a rigid organic light-emitting diode (OLED), comprising steps of:
   providing a first substrate, wherein the first substrate includes a first glass substrate and a flexible film; the flexible film covers the first glass substrate, and the flexible film includes a first area and a second area; the first area corresponds to a display area of the display panel, and the second area corresponds to a non-display area of the display panel;
   coating an organic compound on the first glass substrate;
   providing a second substrate, wherein the second substrate is disposed relative to the first substrate;
   providing a package material between the first substrate and the second substrate, and oppositely bonding the first substrate with the second substrate to package the display area; and
   cutting and stripping a part of the first glass substrate at the non-display area of the packaged display panel.

3. The manufacturing method according to claim 2, further comprising a step of coating the first glass substrate, including: coating an organic compound on a groove disposed inside the first glass substrate.

4. The manufacturing method according to claim 3, wherein the step of coating the organic compound on the groove disposed inside the first glass substrate is coating a polyimide on the first glass substrate.

5. The manufacturing method according to claim 3, wherein a depth of the groove is 10-30 μm.

6. The manufacturing method according to claim 3, wherein an upper surface of the groove coated with the organic compound is at an identical horizontal level with an upper surface of the first glass substrate.

7. The manufacturing method according to claim 2, further comprising a step of:
   providing a package material between the first substrate and the second substrate, and oppositely bonding the first substrate with the second substrate to package the display area, and bonding a flexible printed circuit board with the packaged first glass substrate at the non-display area.

8. The manufacturing method according to claim 7, wherein the flexible printed circuit board includes a first circuit and a second circuit.

9. The manufacturing method according to claim 7, further comprising a step of: bending the flexible printed circuit board and the flexible film to bonding the flexible printed circuit board and the flexible film with a side of the first substrate and the display panel.

10. The manufacturing method according to claim 2, wherein the step of cutting and stripping the part of the first glass substrate at the non-display area of the packaged display panel includes a step of using a laser strip to strip the part of the first glass substrate at the non-display area of the packaged display pane.

11. The manufacturing method according to claim 2, further comprising a step of: fixing and protecting the bent flexible printed circuit board and the bent flexible film.

12. A display panel, comprising:
- a first substrate including a first glass substrate and a flexible film, wherein the flexible film is located above the first glass substrate and includes a first area and a second area; the first area corresponds to a display area of the display panel, and the second area attaches to a side of the display panel; the first glass substrate is provided with a groove configured to conduct a coating of an organic compound;
- a second substrate disposed relative to the first substrate; and
- a package material between the first substrate and the second substrate, and the package material is configured to package the display area.

13. The display panel according to claim 12, wherein a surface of the groove with the coating of the organic compound is at an identical horizontal level with an upper surface of the first glass substrate.

14. The display panel according to claim 13, wherein the groove is configured to conduct a polyimide coating.

15. The display panel according to claim 12, further comprising a flexible printed circuit board at the non-display area, wherein the flexible printed circuit board is attached to the non-display area of the display panel.

16. The display panel according to claim 15, wherein the flexible printed circuit board includes a first circuit and a second circuit.

17. The display panel according to claim 15, wherein the flexible printed circuit board and the flexible film are configured to be bent to be attached to a side of the first substrate and the display panel.

18. The display panel according to claim 12, wherein a part of the first glass substrate at the non-display area is configured to be cut and stripped.

19. The display panel according to claim 18, wherein the part of the first glass substrate at the non-display area is configured to be cut and stripped by using a laser strip.

20. The display panel according to claim 12, further comprising a protecting layer configured to protect the bent flexible film and the bent flexible printed circuit board.

* * * * *